US008545939B2

(12) United States Patent
Donet et al.

(10) Patent No.: US 8,545,939 B2
(45) Date of Patent: Oct. 1, 2013

(54) METHOD AND DEVICE FOR THE INFILTRATION OF A STRUCTURE OF A POROUS MATERIAL BY CHEMICAL VAPOUR DEPOSITION

(75) Inventors: Sebastien Donet, Meaudre (FR); Fabrice Emieux, Voreppe (FR); Lionel Filhol, Saint Sauveur (FR); Stephanie Thollon, Salles (FR)

(73) Assignee: Commissariat a l'Energie Atomique, Paris (FR)

( * ) Notice: Subject to any disclaimer, the term of this patent is extended or adjusted under 35 U.S.C. 154(b) by 806 days.

(21) Appl. No.: 12/669,588

(22) PCT Filed: Jul. 22, 2008

(86) PCT No.: PCT/EP2008/059613
§ 371 (c)(1),
(2), (4) Date: Jan. 19, 2010

(87) PCT Pub. No.: WO2009/013296
PCT Pub. Date: Jan. 29, 2009

(65) Prior Publication Data
US 2010/0189899 A1    Jul. 29, 2010

(30) Foreign Application Priority Data

Jul. 25, 2007  (FR) ..................... 07 56728

(51) Int. Cl.
*C23C 16/06*  (2006.01)
(52) U.S. Cl.
USPC ...... 427/250; 427/244; 427/255.12; 427/900; 118/500; 118/715; 118/728; 118/732

(58) Field of Classification Search
USPC ............. 427/248.1, 250, 249.2, 900, 255.12, 427/243, 244; 118/715, 732, 500, 728
See application file for complete search history.

(56) References Cited

U.S. PATENT DOCUMENTS

| 4,823,734 A * | 4/1989 | Christin ........................ 118/719 |
| 5,904,957 A | 5/1999 | Christin et al. |
| 2001/0048970 A1* | 12/2001 | Hagemeyer et al. ........... 427/217 |
| 2006/0180085 A1* | 8/2006 | Chang ........................... 118/728 |

FOREIGN PATENT DOCUMENTS

| EP | 1 199 109 A1 | 4/2002 |
| EP | 1 285 976 A2 | 2/2003 |
| EP | 1 285 976 A3 | 2/2003 |
| WO | WO 96/15285 | 5/1996 |
| WO | WO 96/15288 | 5/1996 |
| WO | WO 96/33295 | 10/1996 |

OTHER PUBLICATIONS

Christos Christoglou, et al., "Complex Pt/$Al_2O_3$ materials for small catalytic systems", Surface & Coatings Technology, vol. 201, No. 22-23, XP022191959, May 1, 2007, pp. 9195-9199.

(Continued)

*Primary Examiner* — Elizabeth Burkhart
(74) *Attorney, Agent, or Firm* — Oblon, Spivak, McClelland, Maier & Neustadt, L.L.P.

(57) ABSTRACT

A method and a device for infiltration of a structure made of a porous material by chemical vapor deposition. According to the method, a first face of the porous material structure is exposed to a gaseous flow, and the second face is maintained at least partially free from any contact.

10 Claims, 3 Drawing Sheets

(56) References Cited

OTHER PUBLICATIONS

A. Nijmeijer, et al., "Low-temperature CVI modification of γ-alumina membranes", Microporous and Mesoporous Materials, vol. 25, No. 1-3, XP004144177, Dec. 9, 1998, pp. 179-184.

J.L. De La Peña, et al., "Microstructure and kinetics of formation of $Si_2N_2O$ and $Si_3N_4$ into Si porous performs by chemical vapor infiltration (CVI)", Ceramics International, vol. 23, No. 7, XP022183287, Dec. 1, 2006, pp. 1349-1356.

M.I. Pech-Canul, et al., "Effect of processing parameters on the deposition rate of $Si_3N_4/Si_2N_2O$ by chemical vapor infiltration and the in situ thermal decomposition of $Na_2SiF_6$", Applied Physics A Materials Science & Processing, vol. 89, No. 3, XP019540460, Jun. 28, 2007, pp. 729-735.

Xiao-Hong Shi, et al., "Carbon infiltration of carbon-fiber performs by catalytic CVI", Carbon, vol. 44, No. 7, XP005335588, Jun. 2006, pp. 1198-1202.

Z.J. Hu, et al., "Influence of pressure, temperature and surface area/volume ratio on the texture of pyrolytic carbon deposited from methane", Carbon, vol. 41, No. 4, XP004415709, 2003, pp. 749-758.

P.P. Semyannikov, et al., "Chemical Vapor Infiltration Method for Deposition of Gold Nanoparticles on Porous Alumina Supports", Journal of Structural Chemistry, vol. 47, No. 3, XP019451837, May 1, 2006, pp. 458-464.

T.N. Angelidis, et al., "Promotional effect of $SO_2$ on the selective catalytic reduction of $NO_x$ with propane/propene over Ag/γ-$Al_2O_3$", Applied Catalysis B: Environmental, vol. 34, 2001, pp. 201-212.

A. Bueno-López, et al., "Preparation of beta-coated cordierite honeycomb monoliths by in situ synthesis Utilisation as Pt support for $NO_x$ abatement in diesel exhaust", Applied Catalysis B: Environmental, vol. 58, 2005, pp. 1-7.

J.P. Sénateur, et al., "Synthesis and characterisation of YBCO thin films grown by injection-MOCVD", Journal of Alloys and Compounds, vol. 251, 1997, pp. 288-291.

Vania Cominos, et al., "Preparation of axially non-uniform Pd catalytic monoliths by chemical vapour deposition", Applied Catalysis A: General, vol. 210, 2001, pp. 381-390.

* cited by examiner

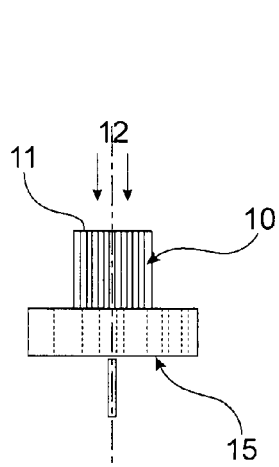
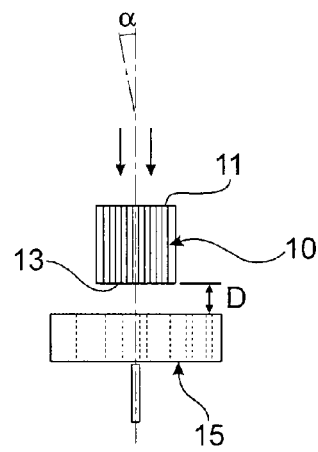
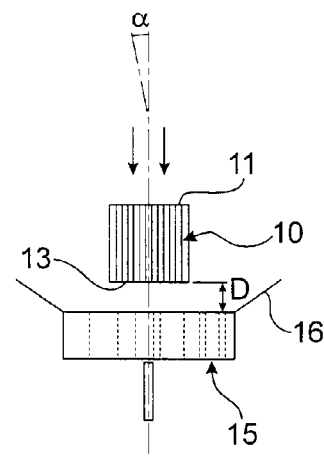
FIG.1A  FIG.1B  FIG.1C
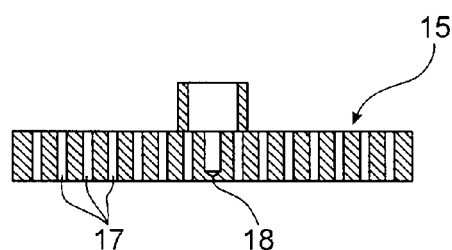
FIG.2A
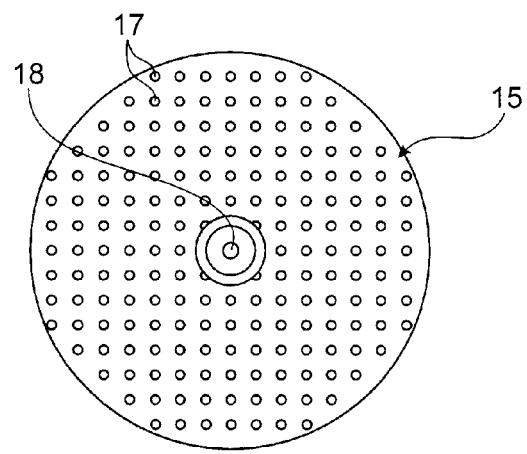
FIG.2B

METHOD AND DEVICE FOR THE INFILTRATION OF A STRUCTURE OF A POROUS MATERIAL BY CHEMICAL VAPOUR DEPOSITION

TECHNICAL FIELD

The present invention relates to a method and device for the infiltration of a structure made of a porous material by chemical vapour deposition (CVD), to obtain in particular multilayers or heterostructures for catalytic systems ("washcoat"+ metal).

STATE OF THE PRIOR ART

"Washcoat"+metal type catalytic systems are available in the form of continuous and uniform thin films and/or particles of nanometric size (diameter from 1 to 100 nm) well dispersed on the surface of a dense or porous structure. Their application areas concern, for example, the catalysis of air (treatment of pollutants: volatile organic compounds (VOC), nitrogen oxides (NOx)), generation of hydrogen by reforming of hydrocarbons, or biofuels or the storage of hydrogen by adsorption.

The conventional technique for forming such catalysts is impregnation by liquid process, for example by deposition of silver particles as described in the document referenced [1] at the end of the description or by deposition of platinum particles as described in the document referenced [2]. The main drawbacks of this technique are as follows:

It requires a high quantity of deposited material: from 5 to 10 times more than by CVD.
It induces a non-uniform deposition due to the flow of liquid within porous structures.
It must be followed by a heat treatment step (drying and calcination).

CVD is in general used to coat smooth surfaces. For structures made of a porous material, a liquid phase deposition is preferred so as to penetrate said structures as best as possible. But such a liquid phase deposition is difficult to control and the deposition thickness is high. There is thus no question of using it to infiltrate materials with very small pores.

The object of the present invention is a method and a device for the infiltration of a structure made of a porous material by chemical vapour deposition enabling the technical problems existing in the solutions of the prior art, as defined above, to be resolved.

DESCRIPTION OF THE INVENTION

The invention relates to a method for the infiltration of a structure made of a porous material by chemical vapour deposition comprising two opposing faces, the first face being exposed to a gaseous flow, the second face being, at least partially, free from any contact, characterised in that a support pierced with parallel channels and provided with a forcing cone is interposed between the gaseous flow and the structure made of porous material, said structure being laid on, or suspended above, said support.

Advantageously, the support is a cylindrical support made of Inconel.

Advantageously, it is also possible to tilt the structure made of porous material by an angle $\alpha$ in relation to the normal of the support, $\alpha$ being between 1 and 15°.

The method of the invention comprises the following steps:
a first step of synthesis of particles or film of oxides,
a second step of dispersion of at least one noble or non-noble metal by CVD,
if necessary another step of dispersion of another noble or non-noble metal by CVD, and
a third step of stabilisation of the catalytic depositions by heat treatment.

In one embodiment, the first step is a step of application of an impregnator or "washcoat", which may be composed of several mixed oxides of different nature, selected from: $Al_2O_3$, $CeO_2$—$ZrO_2$, $BaO_2$, zeolite, $TiO_2/V_2O_5$. In the second step, the metal may be selected from: Pt, Pd, Rh, Au, Ag, Cu, Ru. The structure made of porous material may be a ceramic structure of honeycomb or ceramic foam type.

The invention also relates to a device for the infiltration of a structure made of a porous material by chemical vapour deposition comprising two opposing faces, the first face being exposed to a gaseous flow, and means of maintaining the second face, at least partially, free from any contact, characterised in that said maintaining means comprise a support pierced with parallel channels, and provided with a forcing cone.

Advantageously, the support is a cylindrical support made of Inconel.

In an alternative embodiment, the device of the invention comprises at least two superimposed sub-supports with different opening distributions.

The method of the invention makes it possible to adapt the CVD technique by forcing the gaseous flow to penetrate the structure made of a porous material over its whole thickness. The gaseous flow is thus directed in a favoured manner towards the first face of the porous material structure and the second face of said structure is at least partially freed so as to "suck up" the gaseous flow. The second "open" face may be adapted: number of holes in the structure, height D if the structure is suspended in relation to the support, inclination $\alpha$ of the structure, etc., as a function of the size of the channels and the thickness that it is wished to deposit.

The method of the invention makes it possible to obtain multilayers or heterostructures for catalytic systems ("washcoat" impregnator coat+metal). It makes it possible to deposit oxide type compounds ($Al_2O_3$, $CeO_2$, YSZ, $V_2O_5$, BaO, $TiO_2$, etc.) in the form of continuous or discontinuous films (powders or particles) on a support (or substrate) of porous type. It also makes it possible to deposit group VIII (Fe, Ru, Co, Rh, Ir, Ni, Pd, Pt) and I (Cu, Ag, Au) metal compounds in the form of nanoparticles.

The particular geometry of the support provided with openings enables an efficient impregnation of the porous material structure of filtering support for catalysis type such as a foam or honeycomb with porosities from 2 to 600 cpsi (channels per square inch) and/or 2 to 60 ppi (pores per square inch). It leads to a deposition of uniform active layer not only from the point of view of the thickness but also the structure. The impregnation in depth of the filtering walls of such a filtering support favours the exchange in volume and enables the specific surface to be optimised.

Controlling the operating conditions makes it possible, in addition, to modulate the morphology (size) and the concentration (dispersion) of the catalysts and thus to enable the synthesis of very finely dispersed (inter-particle distance<50 nm) particles of nanometric size (<20 nm).

By means of the method of the invention, it is also possible to deposit complete catalytic systems ("washcoat"+metal) within porous material structures that are complex on their surface (2D) or in their volume (3D). The catalysts are in the form of continuous and uniform thin films and/or particles of nanometric size (diameter from 1 to 100 nm) well dispersed on the surface of a dense or porous support.

The method of the invention finally makes it possible:
- to synthesise catalytic systems in a selective manner on supports by means of an adjustable tube furnace;
- to synthesise parts of varied dimensions by changing the infiltration plate;
- to stabilise the "washcoat" or active catalytic layers by treatment.

The application areas of the method and the device of the invention are for example the catalysis of air (treatment of VOC, NOx), the generation of hydrogen by reforming of hydrocarbons, or biofuels or the storage of hydrogen by adsorption.

BRIEF DESCRIPTION OF DRAWINGS

FIGS. 1A, 1B and 1C illustrate three embodiments of the device of the invention.

FIGS. 2A and 2B illustrate an example of support, respectively in a top view and a sectional view.

DETAILED DESCRIPTION OF SPECIFIC EMBODIMENTS

Figure 3:
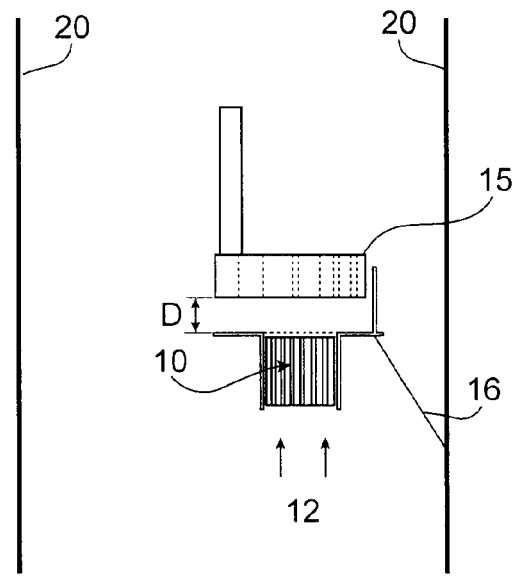
FIG. 3 illustrates the device of the invention implementing the support illustrated in FIG. 2.

As illustrated in FIGS. 1A, 1B and 1C, the method for the infiltration of a porous material structure 10 provided with two opposing faces, by chemical vapour deposition according to the invention, consists in exposing the first face 11 to a gaseous flow 12, the second face 13 being at least partially free from any contact, which makes it possible to control the growth, the density and the size of the particles within the structure 10.

In a first embodiment, illustrated in FIG. 1A, the structure 10 is laid on a support 15 having openings, for example parallel channels 17. In this first embodiment, the films obtained enable a selective infiltration of these channels 17.

In a second embodiment, illustrated in FIG. 1B, the structure 10 is suspended above the support 15 at a distance D from it, said distance D being adjustable. This second embodiment makes it possible to form a deposition gradient between the input (first face 11) and the output (second face 13) of the porous material structure 10.

A third embodiment corresponds to the second embodiment with the implementation of a forcing cone 16 arranged above the support 15. The structure 10 is then fully traversed by the gaseous flow 12, which makes it possible to obtain a uniform deposition over the whole height of the structure 10.

The method of the invention comprises the following steps:
- a first step of deposition of a pre-layer composed of one or more oxides or "washcoat" in the form of a continuous or discontinuous film of thickness generally greater than 20 nm, 50 nm and even 300 nm;
- a second step of dispersion of noble or non-noble metal in the form of nanoparticles of diameter generally less than 20 nm on the "washcoat" deposited previously, with a dispersion in the region of 50 particles per $\mu m^2$;
- if necessary, a third step of stabilisation of the catalytic depositions by heat treatment for example under controlled atmosphere (vacuum or partial pressure of a gas such as $O_2$, $H_2$, Ar).

In the first step, the reaction surface may be considerably increased by the application of a uniform "washcoat" of high specific surface. Said "washcoat" may be composed of one or more mixed oxides of different nature ($Al_2O_3$, $CeO_2$—$ZrO_2$, $BaO_2$, zeolite, $TiO_2/V_2O_5$, etc.).

In the second step, the noble or non-noble metal is the principal component of the catalyst deposited on the "washcoat", which makes it possible in particular to reduce the activation energies of the reactions. This component is generally platinum (Pt) or palladium (Pd); in addition, these materials have good stability. Other noble metals may be used depending on the targeted applications (Rh (rhodium), Au (gold) or non-noble metals (Ag, Cu, etc.)). The vapour phase deposition technique enables the deposition of thin films from organo-metallic precursors or metallic salts. It is thereby possible to form a uniform active layer ("washcoat") composed of mixed oxides or even to deposit in a dense or dispersed manner noble metals on macroporous supports (CVD) in a same reactor adapted to the reaction medium with regard to the production materials.

The method of the invention makes it possible to synthesise catalytic systems composed of continuous and discontinuous thin films deposited within a porous material structure. It enables a real improvement from the point of view of the infiltration of catalytic substrates and their stabilisation (in situ heat treatment) with a view to their integration.

Such a method is "clean" because it uses very little organic solvents and makes it possible to recover pure and dry products that can if necessary then be recycled. In addition, it is not very restrictive in terms of covering complex geometries such as the supports used in the field of the treatment of effluent gases (ceramic foams or honeycombs, etc.).

Compared to conventional methods of CVD deposition of catalysts, the method of the invention enables the formation of an impregnator or "washcoat" then the dispersion of noble or non-noble metals in a same reactor within a 3D porous material structure. This method also enables production in a single enclosure of complete catalytic systems finding direct applications in the field of the treatment of air (for example treatment of VOC, NOx for catalytic converters), for the generation of hydrogen by reforming, or for hydrogen storage materials.

The CVD reactor then used may have a specific geometry with an inflow of reactive gases via the lower part of the reactor as described in the document referenced [3], and as illustrated in FIG. 3. The structures to be coated are thus suspended above the flow of gas, which makes it possible to avoid any pollution by particles, which in this configuration fall back through gravity. In addition, a slide-mounted tubular furnace enables the heat gradient to be adjusted, which makes it possible to deposit in a selective manner at one height or over the whole height of a macroporous support, to heat in a uniform manner the support or to create a heat gradient.

FIGS. 2A, 2B and 3 illustrate an example of circular support 15 made of Inconel for example of 80 mm diameter and 10 mm height. Said support 15 is pierced with openings, for example cylindrical channels 17 of 2 mm diameter, the centres of which are spaced 5 mm apart, and an opening 18 in the shape of channel terminated by a cone in its centre. Such a support enables, on the one hand, an improved infiltration of porous structures and, on the other hand, a good thermal inertia. The flow forcing cone 16, as illustrated in FIG. 1C, enables the whole of the gaseous flow 12 to traverse the porous material structure 10. The expansion of the gas within said structure 10 may be adjusted by modifying the distance D (from 1 to 20 mm) between the support 15 and the structure 10. Reference 20 designates the walls of the CVD reactor.

In the case of one application, for example catalytic converters, the porous structure may have greater dimensions (typically diameter=145 mm, height=100 mm). The porosity of the material being the same as for smaller structures, the size of the openings in the support is also of the same order of magnitude as those of the support for small structures.

In advantageous alternative embodiments, the support 15 may comprise two superimposed sub-supports 30 and 31, the opening distributions of which are different. One of the sub-supports, for example the sub-support 31, may be removable and interchangeable, which makes it possible to adapt the total distribution of the support to the targeted application. Indeed, the selection of certain openings may be desired either to prevent the deposition in certain pores, or to deposit different types of particles depending on the pores.

Figure 5:
FIGS. 5 and 6 schematically illustrate alternative embodiments of the device of the invention.
Figure 5:
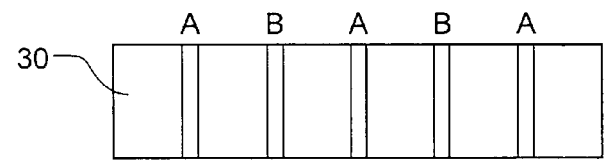
Figure 5:
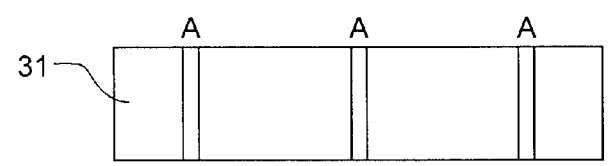
Figure 5:
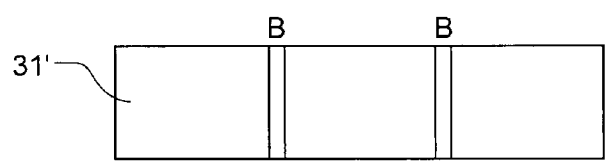
Figure 6:
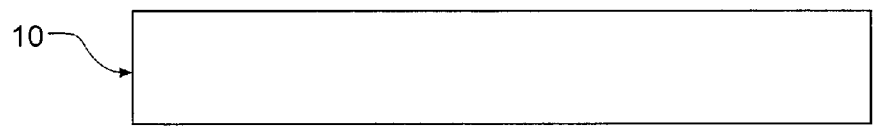
Figure 6:
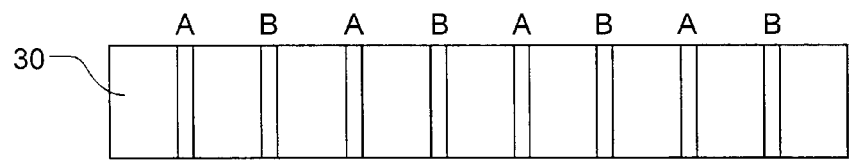
Figure 6:
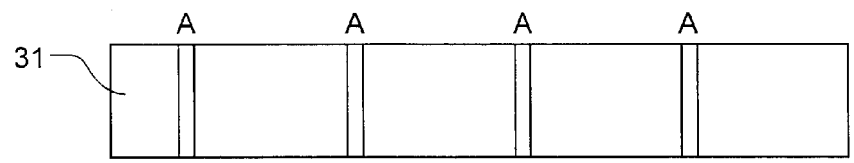

Thus, in a first embodiment illustrated in FIG. 5, in a first step the sub-supports 30 and 31 are superimposed, which makes it possible to fill the pores of the structure 10, vertically to first channels A, by a first material. In a second step, the sub-support 31 is replaced by the sub-support 31', which makes it possible to fill the pores of the structure 10, vertically to second channels B, by a second material. In a second embodiment illustrated in FIG. 6, in a first step, a deposition is carried out with the two sub-supports 30 and 31, which enables filling of the pores of the structure 10, vertically to first channels A, by a first material. In a second step, the sub-support 31 is removed and the pores of the structure 10 are filled, vertically to first and second channels A and B, by a second material.

A same support 15 may also be considered, by displacing the structure 10 in relation to the distribution of the openings of said support (for example by rotation).

Finally, by placing the structure 10 at an adaptable height D above the support 15 having openings, the distribution of the deposition in the pores can be easily modulated by adjustment of this height (as is the case when the support is not pierced) without changing the support.

The structure 10 may also be inclinable along an angle α (for example from 1° to 15°) in relation to the normal to the surface of the support 15. Such an inclination of the structure 10 makes it possible to generate turbulences within channels 17 that lead to a gradient or localised deposition (uniquely at the centre of the structure 10). Such depositions make it possible to improve the theoretical performance of catalysts as described in the document referenced [4].

Example of Embodiment

In one embodiment, the porous material structure 10 is a ceramic structure of honeycomb, ceramic foam type, or any other complex geometric structure.

This dense or macroporous structure may be made of cordierite ($2Al_2O_3.2SiO_2.5MgO$), silicon carbide (SiC), titanium alumina ($Al_2O_3.TiO_2$), zircon alumina ($Al_2O_3.ZrO_2$), etc.

The following steps are then carried out:
deposition of a uniform thin film of "washcoat", which may be composed of Mixed oxides of different nature ($Al_2O_3$, $CeO_2$—$ZrO_2$, $BaO_2$, zeolite, $TiO_2/V_2O_5$, etc.).
chemical vapour deposition, which consists in dispersing noble or non-noble metals (catalysts) on the "washcoat", the noble metals being able to be of different nature depending on the targeted type of catalysis (Pt, Pt/Rh, Ag/Pt/Rh, Ag, Au, etc.).

Figure 4A:
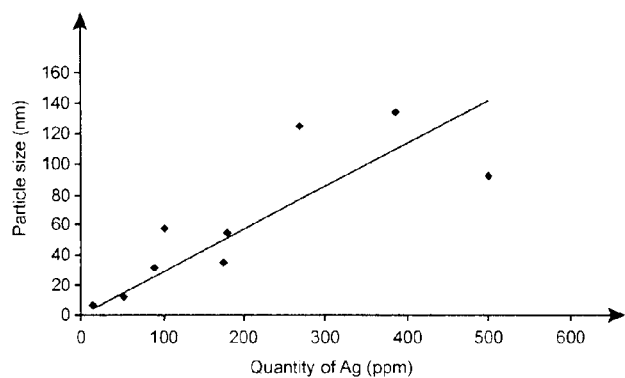
FIGS. 4A and 4B illustrate two examples of measurements giving the size of the particles obtained as a function of the catalyst content.
Figure 4B:
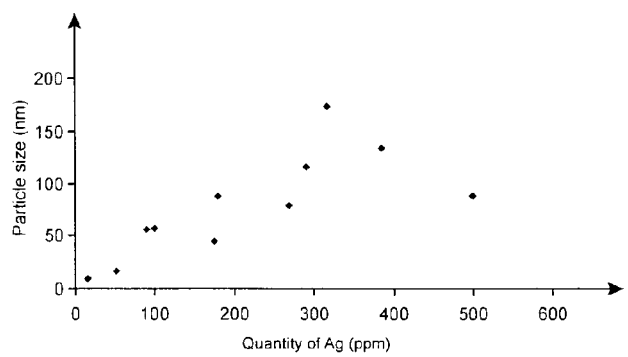

The size of the particles obtained oscillates between 3 and 200 nm, as illustrated in FIGS. 4A and 4B, as a function of the Ag load rate (content) between 20 and 4000 ppm.

It is interesting to note that for each Ag content, the value of the size of the particles at mid-height of the openings of the support (FIG. 4A) is substantially equal to the average value calculated over the whole height of the openings (FIG. 4B): the deposition is thus uniform over the whole height of the openings.

REFERENCES

[1] "Promotional effect of $SO_2$ on the selective catalytic reduction of $NO_x$ with propane/propene over Ag/γ-$Al_2O_3$" by T. N. Angelidis and N. Kruse (Applied Catalysis B: Environmental 34, 2001, pages 201-212).

[2] "Preparation of beta-coated cordierite honeycomb monoliths by in situ synthesis—Utilisation as Pt support for $NO_x$ abatement in diesel exhaust" by A. Bueno-Lopez, D. Lozano-Castello, I. Such-Basanez, J. M. Garcia-Cortes, M. J. Illan-Gomez, C. Salinas-Martinez de Lecea (Applied Catalysis B: Environmental 58, 2005, pages 1-7).

[3] "Synthesis and characterisation of YBCO thin films grown by injection-MOCVD" by J. P. Sénateur, F. Felten, S. Pignard, F. Weiss, A. Abrutis, V. Bigelyte, A. Teiserskis, Z. Saltyte and B. Vengalis (Journal of Alloys and Compounds 251, 1997, pages 288-291).

[4] "Preparation of axially non-uniform Pd catalytic monoliths by chemical vapour deposition" by Vania Cominos and Asterios Gavriilidis (Applied Catalysis A: General 210 (2001), pages 381-390).

The invention claimed is:

1. A method for infiltration by chemical vapor deposition of a structure made of a porous material including first and second opposing faces, the method comprising:
exposing the first face of said structure to a gaseous flow, the second face being, at least partially, free from any contact, and
disposing a support, pierced with parallel channels and provided with a forcing cone, at an output of said structure with regard to the gaseous flow, the structure being suspended above the support.

2. A method according to claim 1, wherein the support is a cylindrical support made of Inconel.

3. A method according to claim 1, wherein the porous material structure is tilted by an angle α in relation to a normal of the support, α being between 1 and 15°.

4. A method according to claim 1, further comprising:
synthesising particles or film of oxides; and
dispersing at least one noble or non-noble metal by CVD.

5. A method according to claim 4, further comprising dispersing another noble or non-noble metal by CVD.

6. A method according to claim 4, further comprising stabilizing the depositions by heat treatment.

7. A method according to claim 4, wherein the synthesizing includes applying an impregnator layer.

8. A method according to claim 7, wherein the impregnator layer includes plural mixed oxides selected from: $Al_2O_3$, $CeO_2$—$ZrO_2$, $BaO_2$, zeolite, or $TiO_2/V_2O_5$.

9. A method according to claim 4, wherein, in the dispersing, the metal is selected from: Pt, Pd, Rh, Au, Ag, Cu, or Ru.

10. A method according to claim 1, wherein the porous material structure is a ceramic structure of honeycomb or ceramic foam.

* * * * *